United States Patent [19]
Cho et al.

[11] Patent Number: 5,270,606
[45] Date of Patent: Dec. 14, 1993

[54] PROCESSING ROBUST ACOUSTIC REFLECTORS

[75] Inventors: Frederick Y. Cho, Scottsdale; Thomas S. Hickernell, Tempe; David Penunuri, Fountain Hills, all of Ariz.

[73] Assignee: Motorola, Inc., Schaumburg, Ill.

[21] Appl. No.: 733,933

[22] Filed: Jul. 22, 1991

[51] Int. Cl.⁵ .............................................. H01L 41/08
[52] U.S. Cl. ................................. 310/313 D; 333/195
[58] Field of Search ........................... 333/153, 195; 310/313 D

[56] References Cited

U.S. PATENT DOCUMENTS

| | | | |
|---|---|---|---|
| 3,931,598 | 1/1976 | Bongianni | 310/313 D |
| 4,249,146 | 2/1981 | Yen et al. | 333/195 |
| 4,267,534 | 5/1981 | Tanski | 333/153 |
| 4,281,301 | 7/1991 | Stevens et al. | 333/195 |
| 4,894,576 | 1/1990 | Okamoto et al. | 310/313 D |
| 4,980,596 | 12/1990 | Sachs et al. | 310/313 D |
| 4,999,535 | 3/1991 | Mariani et al. | 310/313 B |
| 5,010,269 | 4/1991 | Hikita et al. | 310/313 D |
| 5,051,644 | 9/1991 | Wright | 310/313 D |

FOREIGN PATENT DOCUMENTS 1492766  11/1977  United Kingdom ................. 333/153

*Primary Examiner*—Mark O. Budd
*Assistant Examiner*—Thomas M. Dougherty
*Attorney, Agent, or Firm*—Frederick M. Fliegel; Robert M. Handy

[57] ABSTRACT

A reflector arrangement for an acoustic wave device comprises an acoustic wave propagating substrate, reflection elements having at least two different widths separated by at least one gap breadth disposed on the acoustic wave propagating substrate. The at least two different widths enhance reflected waves produced by the propagating acoustic wave in such a fashion to as to achieve a total acoustic reflectivity which is independent of variations in width of the reflection elements.

17 Claims, 5 Drawing Sheets

RATIO OF ELECTRODE WIDTH TO HALF-WAVELENGTH

PROCESSING ROBUST ACOUSTIC REFLECTORS

CROSS REFERENCE TO RELATED APPLICATIONS

This application is related to co-pending U.S. patent applications, Ser. Nos. 694,516 and 504,506, which are assigned to the same assignee as the present invention.

FIELD OF THE INVENTION

The present invention pertains to microelectronic devices employing acoustic waves and more particularly to devices employing acoustic wave reflectors.

BACKGROUND OF THE INVENTION

A broad variety of new demands are being placed on the electromagnetic spectrum, leading to difficulty in allocating radio wave frequency bands as new kinds of equipment based on radio wave communication are developed. Several recent examples of such developments include extremely light-weight, hand-portable cellular telephones, wireless local area networks for linking computer systems within office buildings in a readily reconfigurable fashion, wireless infant monitors, wristwatch-sized paging apparatus, and a host of other devices for promoting rapid, efficient, and flexible voice and data communication.

This has resulted in pressure to employ progressively higher radio frequencies (e.g., >500 MegaHertz) and need to create requirements for frequency selection components capable of high frequency operation and increasingly narrow passbands. Additionally needed are low insertion loss coupled with improved out-of-band signal rejection, in a small form factor and with low power consumption.

To meet these demands, there is at the present time much effort and expense going into research and development relating to acoustic wave devices such as filters, delay lines, resonator devices and lattice filters for a variety of practical applications. Acoustic wave devices are becoming particularly important in the construction of electronic signal processing equipment, such as radios, paging devices, and other high frequency electronic apparatus, because they can be readily constructed on planar surfaces using integrated circuit fabrication techniques, are robust and compact, require no initial or periodic adjustment, and consume no static power.

These devices operate by conversion of electrical signal energy into acoustic energy, which then propagates through or in the near surface region of a suitable acoustic medium. This energy conversion process often relies on the piezoelectric effect as manifested by materials which form certain non-centrosymmetric crystal types, such as ZnO, CdTe, $LiNbO_3$, $LiTaO_3$, $SiO_2$, $BiGeO_{20}$, GaAs, and the like. Acoustic energy is usually converted back to electrical energy by another or the originating transducer, producing the desired electronic performance. A basic equation describing signal frequency $f_{sig}$, acoustic wavelength $\lambda$, and properties of the acoustic medium is:

$$\lambda f_{sig} = v_s, \quad (1)$$

where $v_s$ represents acoustic velocity in the acoustic medium. For a given acoustic velocity $v_s$, increased $f_{sig}$ requires reduced $\lambda$.

Wave propagating acoustic transducers rely on electrodes which are usually a fraction of a wavelength in width. Photolithographic constraints together with Eq. 1 determine an upper frequency limit by setting a lower electrode width limit. The current minimum electrode width is about one micrometer for practical mass-production equipment and techniques. This minimum electrode width sets the upper frequency limit between about one and two GigaHertz. At present, this is a frequency range of intense interest for development of new electronic products.

The material used for the transducer electrodes typically has either mass density or stiffness mismatch to the acoustic impedance of the acoustic medium. This often results in acoustic reflections from electrode structures. Examples of dense materials providing mass mismatch include gold, silver, osmium, and the like. Materials which are extremely stiff, and so produce stiffness mismatch, include chromium and tungsten.

Further, the mere presence of conductive materials engenders acoustic impedance mismatch through the piezoelectric effect, resulting in acoustic reflections. Materials such as aluminum and alloys thereof, which are flexible, have low density, are excellent electrical conductors, and which are easily prepared and patterned in thin film form, are preferred for such acoustic device electrodes.

Control of fabrication variables, such as the ratio of electrode width to spacing, metal thickness, and the like, becomes progressively more difficult as photolithographic limits are approached, i.e., as the desired electrode widths become smaller. This results in reduced fabrication yields for devices requiring electrode widths at or near the photolithographic and etching limits.

What is needed are techniques for device realization which are insensitive to manufacturing variations, which do not result in significant compromise of device capabilities or performance, and which are easily implemented in a fashion consistent with current acoustic device design, fabrication and use practices.

SUMMARY OF THE INVENTION

In accordance with the present invention, a novel method and acoustic wave device reflector arrangement is disclosed.

The novel acoustic wave device comprises: (1) an acoustic wave propagating substrate, (2) reflection elements having at least two different widths disposed on the acoustic wave propagating substrate, (3) gaps having one or more breadths disposed between the reflection elements, to enhance reflected acoustic waves so to as to achieve acoustic reflectivity which is independent of manufacturing variations in the reflection element width.

A method for making an electro-acoustic device which achieves acoustic reflectivity independent of fabrication-related reflection element width variations comprising the steps of: (1) providing an acoustic wave propagating substrate, (2) disposing on the substrate reflection elements having at least two different widths separated by gaps having at least one breadth.

DESCRIPTION OF THE PREFERRED EMBODIMENT

A broad variety of different acoustic eigenmodes have applications in microwave acoustic devices for frequency selection. These include surface acoustic waves (SAWs), or Rayleigh waves; surface skimming bulk acoustic waves (SSBAWs); shallow bulk acoustic waves (SBAWs); surface transverse waves (STWs); Stonely, Sezawa, Love, and other plate and higher order acoustic eigenmodes; longitudinal and shear bulk acoustic waves (BAWs); line acoustic waves (LAWs); and so on. For convenience of explanation, the present invention is described in terms of surface acoustic waves (SAWs), with the understanding that other varieties of acoustic propagation are also applicable, including but not limited to those listed above.

The terms "surface acoustic wave", "acoustic wave", and "surface wave" or "SAW", are employed interchangeably herein to stand for any suitable type of acoustic wave propagation. The terms "substrate material", "substrate", "acoustic wave propagating substrate", and "acoustic medium" are employed interchangeably herein to stand for any substrate that supports propagation of acoustic waves. The terms "reflection element" and "reflection electrode" are employed interchangeably herein to stand for reflection elements composed of electrodes.

SAW devices operate at UHF and VHF frequencies, ranging from several tens of MegaHertz to several GigaHertz, where other types of frequency selection components operate with limited effectiveness.

Figure 1:
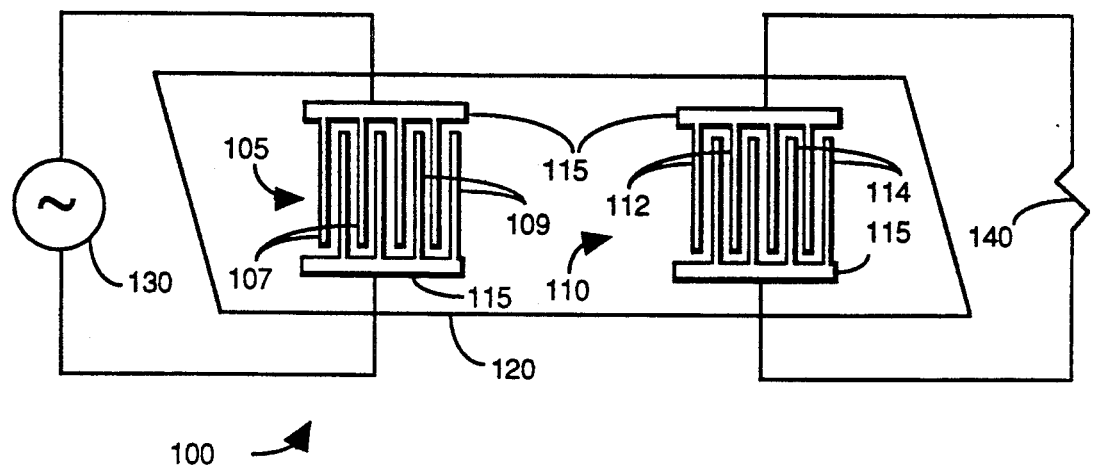
FIG. 1 is a plan view of an acoustic wave filter in accordance with the prior art.

FIG. 1 is a plan view of an acoustic wave filter 100 in accordance with the prior art. Acoustic wave filter 100 comprises substrate 120 and transducers 105, 110 connected to signal source 130 and load 140. Transducers 105, 110 further comprise busses 115 and comb electrodes 107, 109, 112, 114. Transducers 105, 110 convert electrical to acoustic energy, and vice versa. Interdigitated comb electrodes 107, 109, 112, 114 interconnected by busses 115 are made of thin-film metal, deposited, for example, by vacuum evaporation, on the polished surface of substrate material 120 which is in whole or in part piezoelectric. Comb electrodes 107, 109, 112, 114 making up acoustic wave transducers 105, 110 are typically defined photolithographically, using processes well known in the art.

The piezoelectric nature of substrate material 120 causes mechanical waves to be emitted from transducer 105 when excited by electrical signals from signal source 130 having an appropriate frequency, and conversely transducer 110 delivers electrical output signals to load 140 when transducer 110 is appropriately insonified.

Alternatively, thin-film overlays of piezoelectric material, for example, ZnO deposited by dc triode sputtering, can be employed on non-piezoelectric materials such as, for example, single-crystal Si, to allow piezoelectric excitation of acoustic energy on nonpiezoelectric substrates. The piezoelectric overlay material can be deposited over the entire surface of the substrate, or may be limited to the transducer 105 alone, for example, by the technique of shadow-masking, as is well known in the art. See, for example, "An integrated ZnO/Si-MOSFET programmable matched filter," by F. S. Hickernell, M. Adamo, A. London, and H. Bush, 1975 IEEE Ultrason. Symp. Proc., pp. 223-226. Surface acoustic waves can be sustained on a broad variety of materials and can be transduced by any means capable of mechanical motion.

In many types of SAW devices, it is extremely desirable to fashion acoustic reflectors for reversing the direction of propagation of acoustic energy at a specified place. This is accomplished by means of periodic structures of reflection elements composed of grooves, or strips of material, or a combination thereof, placed on or penetrating into the acoustic medium surface. When the reflection properties of these individual reflection elements are not constant from one to another due to variations in manufacturing tolerances, device performance and so device yields are adversely affected.

Figure 2A:
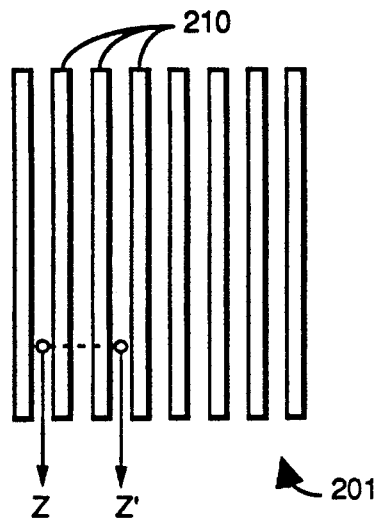
FIG. 2A is a plan view of an acoustic reflector structure in accordance with the prior art.

FIG. 2A is a schematic plan view of acoustic reflector structure 201 comprising reflector elements 210. Reflector elements 210 are oriented such that their long edges are oriented parallel to acoustic equi-phase fronts.

Figure 2B:
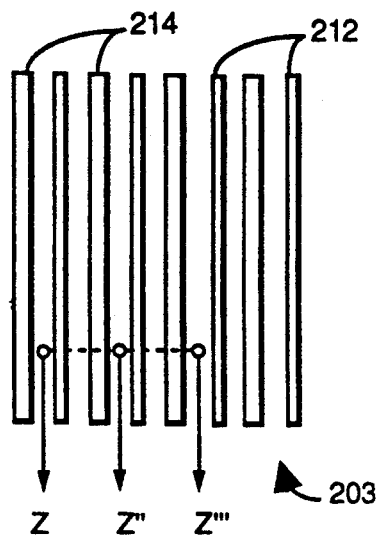
FIG. 2B is a plan view of an acoustic reflector structure in accordance with one embodiment of the present invention.

FIG. 2B is a plan view of acoustic reflector structure 203 in accordance with one embodiment of the present invention, comprising reflector elements 212, 214 having differing widths.

While the acoustic reflector structures 201 of FIG. 2A and 203 of FIG. 2B are illustrated as having reflector elements 210 and 212, 214, respectively, which are electrically independent of one another, this is not an essential feature of the present invention.

Figure 2C:
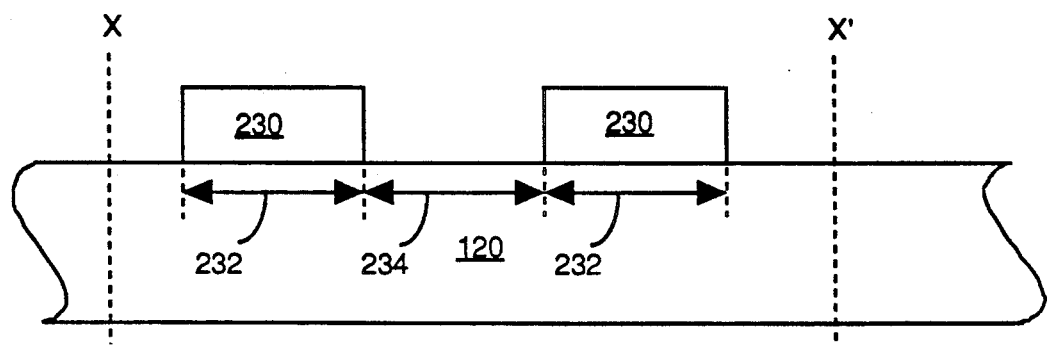
FIG. 2C is cross-sectional view of a portion of a reflection element structure in accordance with the prior art.
Figure 2D:
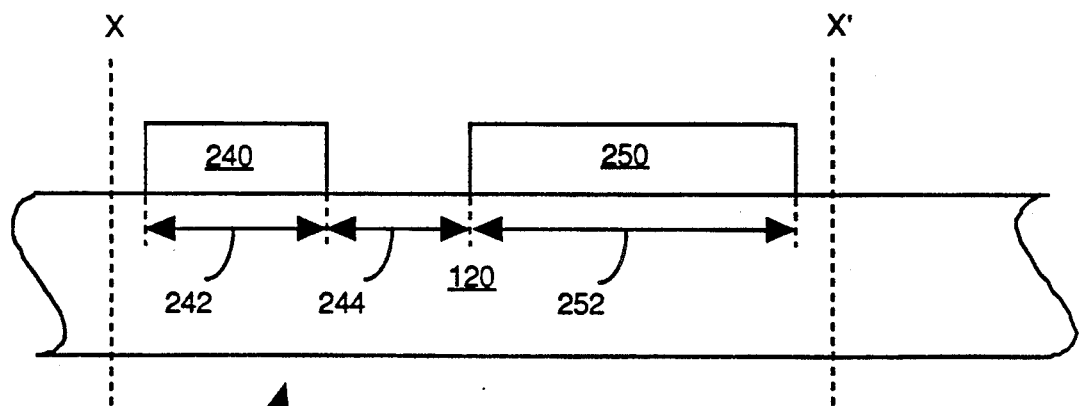
FIG. 2D is cross-sectional view of a portion of a reflection element structure in accordance with the present invention.

FIG. 2C is a cross-sectional view of a portion 205 of prior art reflector structure 201 of FIG. 2A on substrate 120, comprising reflection elements 230 having width 232 and separated by gaps of breadth 234. The cross-section of FIG. 2C is taken along cut Z, Z' of FIG. 2A. FIG. 2D is a similar cross-sectional view of a portion 207 of reflector structure 203 of FIG. 2B on substrate 120 comprising reflector elements 240, 250 having widths 242, 252, respectively, separated by a gap of breadth 244, according to a first embodiment of the present invention. The cross-section of FIG. 2D is taken along cut Z, Z" of FIG. 2B.

Figure 2E:
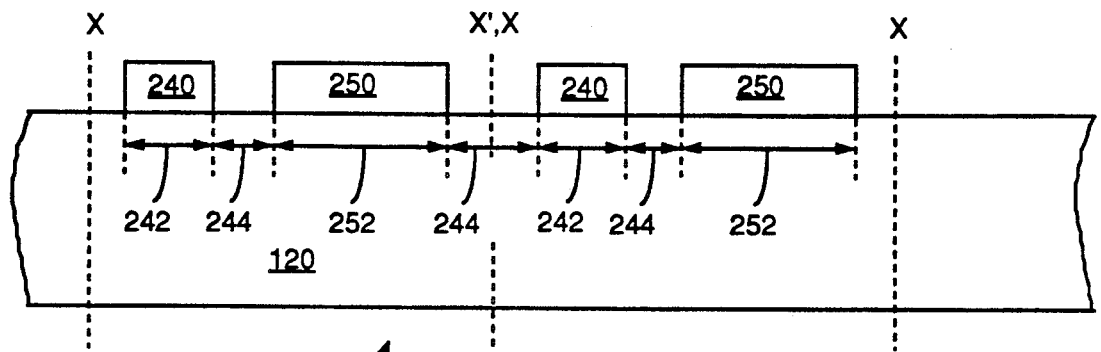
FIG. 2E is a cross-sectional view of concatenated structures according to FIG. 2D.
Figure 2F:
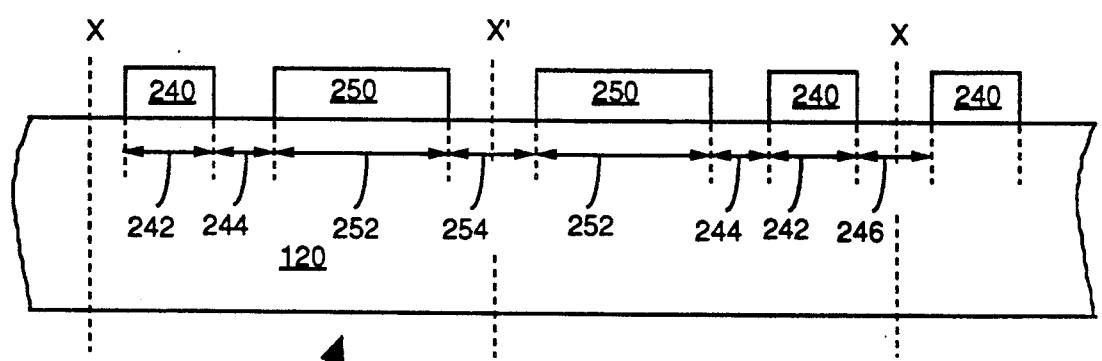
FIG. 2F is a cross-sectional view of concatenated structures, according to FIG. 2D and a mirror image of FIG. 2D.

FIG. 2E is a cross-sectional view of structure 209 comprised of repetitively concatenated structures 207 of FIG. 2D on substrate 120. Structure 209 of FIG. 2E comprises reflection elements 240, 250 of widths 242, 252, respectively, separated by gaps of breadth 244. FIG. 2F is a cross-sectional view of structure 211 comprising repetitive concatenation of structure 207 of FIG. 2D (left side of FIG. 2F) and the mirror image thereof (right side of FIG. 2F) on substrate 120. Structure 211 of FIG. 2F comprises reflection elements 240, 250 of widths 242, 252, respectively, separated by gaps of breadths 244, 246, 254. The cross-section of FIG. 2E and 2F is taken along cut Z, Z''' of FIG. 2B with the reflection elements arranged in the order 240, 250, 240, 250 from left to right (see FIG. 2E). The cross-section of FIG. 2F is similar to that of FIG. 2E but with the order of every other reflection element pair reversed, e.g., 240, 250; 250, 240 from left to right (see FIG. 2F).

Figure 3:
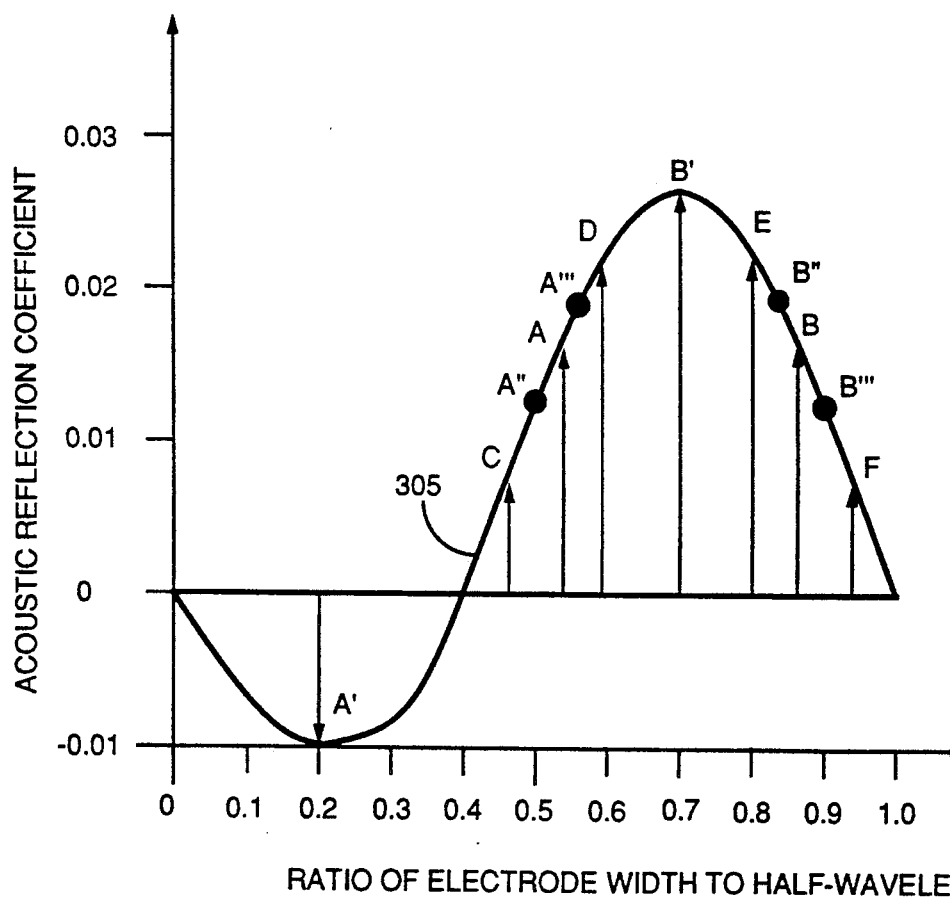
FIG. 3 illustrates the calculated reflectivity of a single reflection element versus electrode width to acoustic wavelength ratio.
Figure 2G:
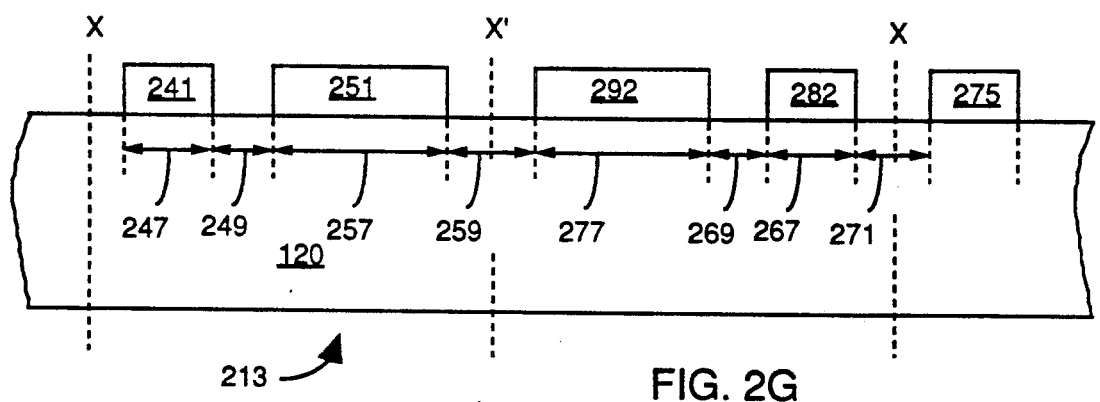
FIG. 2G is a cross-sectional view of a portion of an acoustic reflector (e.g., analogous to Z, Z''', FIG. 2B) in accordance with the present invention.

FIG. 2G is a cross-sectional view of structure 213 (e.g., analogous to Z, Z''', FIG. 2B) comprising reflection elements 241, 251, 292 and 282 having distinct widths 247, 257, 277 and 267, respectively, disposed on substrate 120. Widths 247, 267, 257 and 277 may correspond, for example, to C, D, E and F (FIG. 3, discussed infra). Reflection elements 241, 251 are separated by a gap of breadth 249. Reflection elements 251, 292 are separated by a gap of breadth 259. Reflection elements 292, 282 are separated by a gap of breadth 269. Breadths 249, 259, 269 are distinct.

The vertical scale is greatly compressed in FIGS. 2C–G; acoustic medium 120 is typically tens to hundreds of acoustic wavelengths (on the order of one-half millimeter) thick, while the horizontal distance between X and X' corresponds to one acoustic wavelength (on the order of several to about fifty micrometers). The height of reflection elements 230 of FIG. 2C, 240, 250, of FIGS. 2D–F and 241, 251 of FIG. 2G is typically in the hundreds to thousands of Angstroms. FIGS. 2C–G assume acoustic propagation from right to left, or vice versa, near the top surface of acoustic medium 120.

Reflector structure portion 205 of FIG. 2C consists of metal strips 230 of equal width 232 separated by one or more gaps of breadth 234 nominally equal to width 232 disposed on acoustic medium 120. The structure of FIG. 2C has the disadvantage that any variation of reflection element width 232 alters the acoustic reflection coefficient, with corresponding device performance changes. Thus, the prior art reflection element arrangement of FIGS. 2A, 2C is very susceptible to performance degradation arising from manufacturing variations.

It has been discovered that variations in reflector element performance caused by variations in manufacturing tolerances can be avoided by employing two or more kinds of reflection elements in combination, whose reflection behavior is affected in equal and opposite ways by the same manufacturing variance.

FIGS. 2B, 2D illustrate a reflector structure having this insensitivity to manufacturing variations. Reflector structure 207 of FIG. 2D has the property of exhibiting constant acoustic reflection magnitude despite systematic width variations of reflection elements 240, 250. Reflection elements 240, 250 are conveniently metal strips of differing widths disposed on acoustic medium 120.

FIG. 3 illustrates calculated reflectivity 305 versus the ratio of electrode width to acoustic wavelength. This plot applies to a reflection element composed of a single conductive electrode on the surface of a crystal of 128° Y-cut, X-propagating $LiNbO_3$, when the reflection element is oriented with the long axis normal to the wave propagating direction. FIG. 3 illustrates reflection coefficient 305 which is negative from ratios of electrode width to acoustic half-wavelength of zero to slightly less than 0.4 and having a maximum negative excursion of about −0.01 at a ratio of slightly less than 0.2 Reflection coefficient 305 is positive for ratios of electrode width to acoustic half-wavelength of from slightly less than 0.4 to one half-wavelength and has a maximum positive excursion at a ratio of electrode width to acoustic half-wavelength of slightly more than 0.7. A plurality of different electrode widths A, A", A''', B, B", B''', C, D, E and F are noted within the positive lobe of reflection coefficient 305. FIG. 3 is calculated for an aluminum electrode 3000 Angstroms thick and an acoustic frequency of about 900 megaHertz, however, this general curve shape is obtained for a variety of different conditions for this material.

Further discussion of acoustic reflections is found in Wright, "Modelling and experimental measurements of the reflector properties of SAW metallic gratings," Proc. 1984 IEEE Ultrason. Symp., pp. 54–63, and also in Penunuri et al., "Single-phase, unidirectional transducer design for charge transport devices," Proc. 1990 Ultrason. Symp., pp. 237–242.

It is observed that acoustic reflection coefficient magnitudes tend to peak for particular electrode widths of about and tend towards zero for other electrode widths. For the conditions of electrode widths of zero or one wavelengths, discontinuities are no longer present in the acoustic propagation conditions since the film comprising the electrode is either absent or continuous.

It has been found that this behavior may be used to advantage to achieve aggregate acoustic reflection magnitudes which are insensitive to electrode width variations. This is accomplished by employing multiple electrode widths. This approach is broadly applicable to acoustic substrata, since both positive and negative slopes of reflection coefficient versus reflection element width are available, independent of the materials employed for device realization.

Reflectivities per electrode for electrodes 240, 250 of FIG. 2D are shown at locations A and B of FIG. 3. When electrodes 240, 250 have the design target widths 242, 252 indicated by arrows A, B in FIG. 3, they provide equal reflection coefficient magnitudes. In accordance with FIG. 3, width 242 is 0.28λ and width 252 is 0.44λ, for example. This provides gap breadths, for example, of 0.14λ for gap breadth 244 of FIGS. 2C–F, and gap breadths of 0.06λ and 0.22λ for breadths 254 and 246 of FIG. 2F. Manufacturing variations may cause their widths to be larger or smaller than their design target widths, so that their individual reflection coefficients are no longer equal. However, by choosing their design widths so that one lies to the left of the peak at B' of curve 305 and the other lies to the right of peak B' of curve 305, the sum of the reflection coefficients of electrodes 240, 250 remains constant even though the individual reflection coefficients vary.

For example, over-etching of electrodes 240, 250 causes the individual electrode widths and corresponding individual reflection coefficients of A to shift to A″ and B to shift to B″, while the combined reflection coefficients of A+B =A″+B″. Conversely, under-etching causes A, B to shift to A‴, B‴, respectively, but with A+B=A‴+B‴.

Also shown in FIG. 3 are locations C, D, E, F, wherein C, F (e.g., reflection elements 241, 251 of FIG. 2G) correspond to similar magnitudes of reflection coefficient, and analogously, D, E. (e.g., reflection elements 292, 282 of FIG. 2G) Acoustic reflectors composed of electrodes of widths C, D, E, F, or C, F, or D, E will also exhibit acoustic reflection properties independent of fabricated electrode width.

Similarly, many other combinations of electrode widths provide this important advantage when these widths are chosen in groups, with each group having total reflection coefficients of similar magnitude and opposed acoustic reflection coefficient slope versus electrode width. The numbers of reflection elements comprising each group may differ.

A further variation is also possible in gap breadth without altering the properties of the acoustic reflector. The arrangement of FIG. 2D may be replicated in two basic fashions to form a reflector array. These are to concatenate adjacent sections as depicted in FIG. 2D such that X of one section corresponds to X′ of the adjacent section, and to concatenate adjacent sections which are mirror images of one another, with X (or X′) of one section corresponding to X (or X′) of the adjacent section. These juxtapositions are illustrated in FIGS. 2E and 2F, respectively.

These two configurations differ in that FIG. 2E illustrates two reflection element widths and a single gap breadth, whereas FIG. 2F depicts two reflection element widths and three distinct gap breadths.

Figure 4:
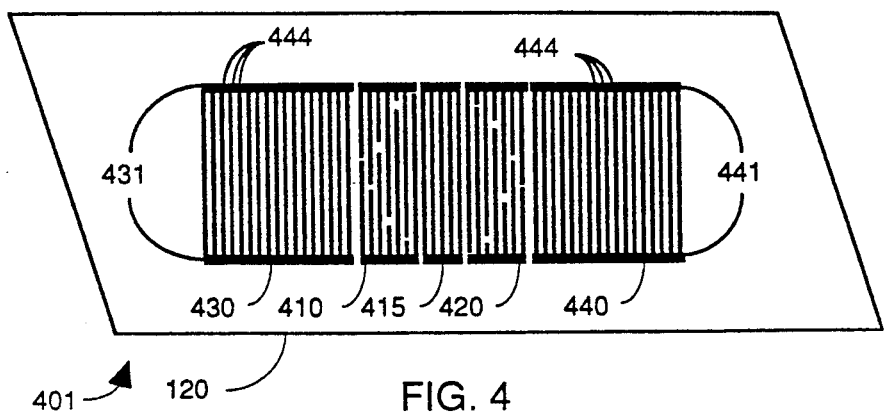
FIG. 4 is a simplified plan view of a resonator comprising a pair of SAW transducers enclosed between a pair of acoustic reflectors, in accordance with the present invention.

One way to determine the reflection coefficient for an acoustic reflector is to measure the bandwidth achieved by a device of the type depicted in FIG. 4. Shown in FIG. 4 are a pair of SAW transducers 410, 420 enclosed between a pair of acoustic reflectors 430, 440, having busses 431, 441, all disposed on substrate 120. Acoustic reflectors 430, 440 form a resonant cavity having properties similar to Fabry-Perot resonators and the like. The transmission response bandwidth from transducer 410 to transducer 420 directly measures acoustic reflector 430, 440 reflectivity, with broader responses occurring for reflectivities approaching unity.

Buses 431, 441 electrically interconnect the individual reflection electrodes 444 comprising acoustic reflectors 430, 440, in contrast to the arrangement of FIGS. 2A an 2B. Either method can be used to realize efficient acoustic reflection in accordance with the present invention.

FIGS. 5–8 provide measured data taken from a group of devices manufactured on a crystal of 128° Y-cut, X-propagating LiNbO$_3$ substrate, employing Al electrodes having a thickness of nominally 3100 Angstroms and center frequencies of about 485 MegaHertz, corresponding to an acoustic wavelength of about eight micrometers. The devices which provided the responses depicted in FIGS. 5 and 7 were fabricated on one wafer, while the devices which provided the responses illustrated in FIGS. 6 and 8 were fabricated on a second wafer, all from a single photomask having both distinct device patterns thereon.

Figure 5:
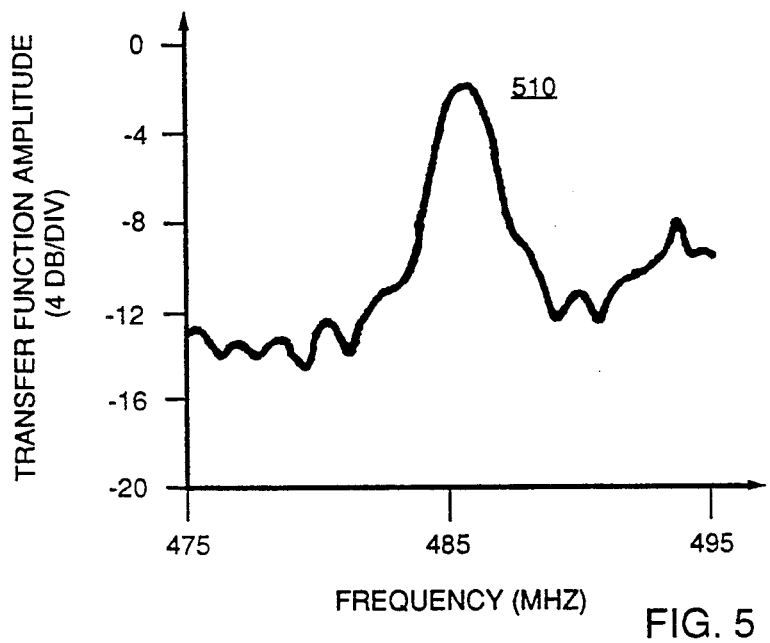
FIG. 5 is a graph of a transmission response of a first resonator device in accordance with the present invention.
Figure 6:
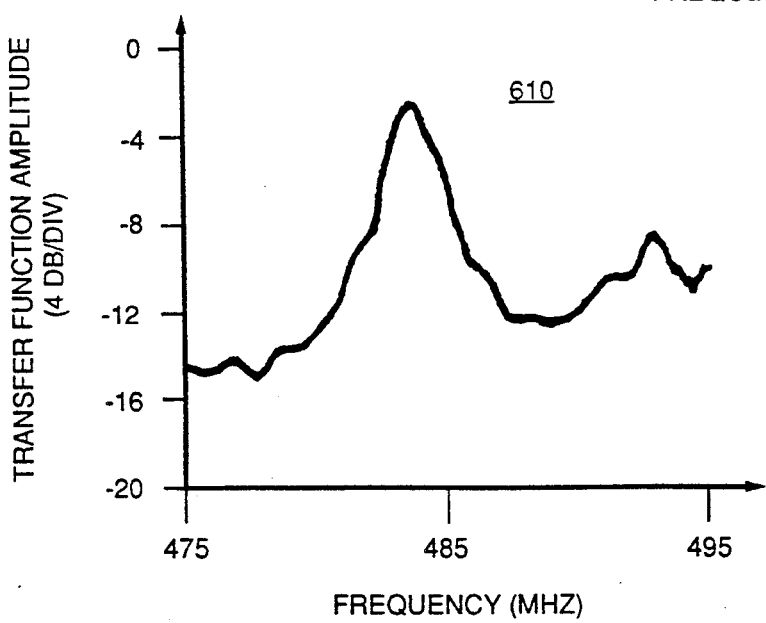
FIG. 6 is a graph of a transmission response of a second resonator device in accordance with the present invention.

FIG. 5 is a graph of transmission response 510 for a device employing reflection elements as depicted in FIGS. 2D, 2E. FIG. 6 is also a graph of transmission response 610 for a device employing reflection elements as depicted in FIGS. 2D, 2E, wherein the reflection elements are broader in width due to under-etching than were those of the device from which data 510 were measured. Data 510 of FIG. 5 and 610 of FIG. 6 are quite similar.

Figure 7:
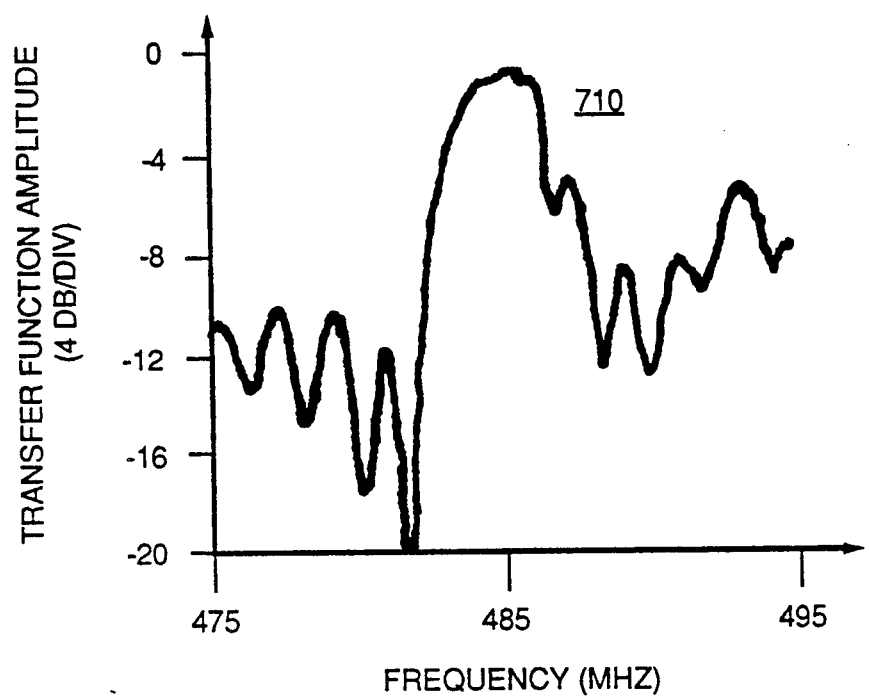
FIG. 7 is a graph of a transmission response for a first prior art resonator device.
Figure 8:
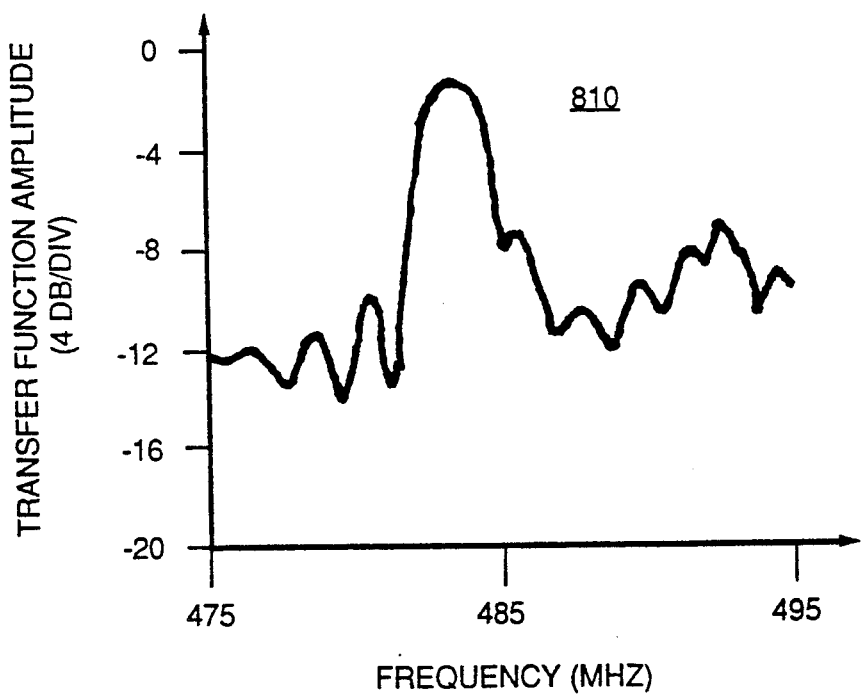
FIG. 8 is a graph of a transmission response for a second prior art resonator device.

FIG. 7 is a graph of transmission responses 710 for a device employing only one reflection element width as depicted in FIG. 2C, while FIG. 8 shows a graph 810 of a response for a similar device, again where electrode widths are larger due to under-etching in the device corresponding to FIG. 8. Comparison of data 510, 610, 710, 810 provided in FIGS. 5–8 shows greater measured device performance changes versus electrode width in data 710, 810 of FIGS. 7 and 8 than are present in data 510, 610 of FIGS. 5 and 6.

This illustrates that the method of choosing electrode widths to maintain a constant total reflector reflectivity provides improved device performance, even in the presence of manufacturing variations which alter reflection properties of individual electrodes comprising the device.

Although the preferred embodiment of the invention has been illustrated, and that form described in detail, it will be readily apparent to those skilled in the art that various modifications may be made therein without departing from the spirit of the invention or from the scope of the appended claims.

What is claimed is:

1. An acoustic wave device having a reflector arrangement, the acoustic wave device comprising:
   an acoustic wave propagating substrate;
   a first acoustic reflector comprising:
   a first plurality of reflection elements disposed on said acoustic wave propagating substrate, said first plurality of reflection elements including first reflection elements each having a first width and a first reflection coefficient A, said first reflection coefficient A occurring to a first side of a local extremum of reflection coefficient versus electrode width, and second reflection elements each having a second width and a second reflection coefficient B, said second reflection coefficient B occurring to a second side of said local extremum, said second width being different from said first width; and
   a plurality of gaps having at least a first breadth disposed between said first and said second reflection elements, wherein said first and second reflection coefficients have a sum A+B which is unaffected by a manufacturing width variance in both reflection element first and second widths, providing modified first and second reflection coefficients A″ and B″, respectively, such that A+B=A″+B″; a second acoustic reflector comprising:
   a second plurality of reflection elements disposed on said acoustic wave propagating substrate, said second plurality of reflection elements comprising third reflection elements having a third width and fourth reflection elements having a fourth width different than said third width; and
   at least a first acoustic transducer disposed between said first and second acoustic reflectors.

2. The acoustic wave device having a reflector arrangement as claimed in claim 1, wherein said acoustic wave propagating substrate comprises a piezoelectric substrate.

3. The acoustic wave device having a reflector arrangement as claimed in 2, wherein said acoustic wave propagating substrate comprises one hundred twenty eight degree Y-cut, X-propagating lithium niobate.

4. The acoustic wave device having a reflector arrangement as claimed in claim 3, wherein said plurality of reflection elements comprise aluminum.

5. The acoustic wave device as claimed in claim 1, wherein said first and second widths are greater than 0.2 of an acoustic wavelength.

6. The acoustic wave device as claimed in claim 1, wherein said plurality of gaps comprise first gaps having a first breadth, second gaps having a different second breadth and third gaps having a still different third breadth.

7. The acoustic wave device as claimed in claim 1, wherein said first and second reflection coefficients have similar magnitudes.

8. An acoustic wave device having a reflector arrangement, the acoustic wave device comprising:
an acoustic wave propagating substrate;
a first acoustic reflector comprising:
first pairs of first reflection elements, said first reflection elements each having a first width and a first acoustic reflection coefficient A, said first pairs of first reflection elements interposed with second pairs of second reflection elements, said second reflection elements each having a second width and a second acoustic reflection coefficient B, said first and second pairs disposed on said acoustic wave propagating substrate, said first and second acoustic reflection coefficients having similar magnitudes and separated by a local extremum of acoustic reflection coefficient versus reflection element width;
first gaps having a first breadth disposed between said first pair of reflection elements;
second gaps having a second breadth disposed between said second pair of second reflection elements; and
third gaps having a third breadth disposed between said first pairs of reflection elements and said second pairs of reflection elements, wherein said first, second and third breadth and said first and second width operate together to provide a combined acoustic reflectivity A+B invariant of similar variations in the fabricated first and second reflection element widths, providing third and fourth reflection coefficients A" and B", such that A+B=A"+B"; a second acoustic reflector comprising:
a plurality of reflection elements disposed on said acoustic wave propagating substrate, said plurality of reflection elements comprising third reflection elements having a third width and fourth reflection elements having a fourth width different than said third width; and
at least a first acoustic transducer disposed between said first and second acoustic reflectors.

9. An acoustic wave device having a reflector arrangement comprising:
an acoustic wave propagating substrate;
first, second, third and fourth reflection elements having first, second, third and fourth widths, respectively, disposed on said acoustic wave propagating substrate, said first, second third and fourth reflection elements having first, second, third and fourth acoustic reflection coefficients, respectively, said first and second acoustic reflection coefficients having similar magnitudes, first acoustic reflection coefficient disposed to a first side of a peak value of acoustic reflection coefficient versus reflection element width, said second acoustic reflection coefficient disposed to a second side of said peak value, said third and fourth acoustic reflection coefficients having similar magnitudes, said third acoustic reflection coefficient disposed to said first side, said fourth acoustic reflection coefficient disposed to said second side;
first gaps having at least a first breadth disposed between said first, second, third and fourth reflection elements, wherein said first breadth and first, second, third and fourth widths provide a combined acoustic reflectivity independent of the fabricated reflection element width.

10. An acoustic wave device having a reflector arrangement, said reflector arrangement comprising:
an acoustic wave propagating substrate;
first, second, third and fourth reflection elements having first, second, third and fourth widths, respectively, disposed two per acoustic wavelength on said acoustic wave propagating substrate, said first, second, third and fourth reflection elements having first, second, third and fourth acoustic reflection coefficients, respectively, said first and second acoustic reflection coefficients having similar magnitudes, said first acoustic reflection coefficient disposed to first side of an extremal value of acoustic reflection coefficient versus reflection element width, said second acoustic reflection coefficient to a second side of said extremal value, said third and fourth acoustic reflection coefficients having similar magnitudes, said third acoustic reflection coefficient disposed to said first side, said fourth acoustic reflection coefficient disposed to said second side;
first, second and third gaps having first, second and third breadths, respectively, said first gap disposed between said first and second reflection elements, said second gap disposed between said second and third reflection elements, said third gap disposed between said third and fourth reflection elements, wherein said first, second and third breadths and said first, second, third and fourth widths provide a combined acoustic reflectivity which is independent of the fabricated first, second, third and fourth reflection element widths.

11. An acoustic wave device having a reflector arrangement comprising:
an acoustic wave propagating substrate;
a first acoustic reflector comprising a first plurality of reflection elements disposed on said acoustic wave propagating substrate, said first plurality of reflection elements comprising first reflection elements having a first width and second reflection elements having a second width different than said first width, said first reflection elements having a first acoustic reflection coefficient, said second reflection elements having a second acoustic reflection coefficient, said first and second acoustic reflection coefficients varying in opposite fashions for a similar variation in said first and second widths;
a second acoustic reflector comprising a second plurality of reflection elements disposed on said acoustic wave propagating substrate, said second plurality of reflection elements comprising third reflection elements having a third width and fourth reflection elements having a fourth width different than said third width;

said first width and said second width providing a combined acoustic reflection coefficient which is independent of variations in reflection element width; and at least a first acoustic transducer disposed between said first and second acoustic reflectors.

12. The acoustic wave device of claim 11 wherein said acoustic wave propagating substrate includes lithium niobate.

13. The acoustic wave device of claim 11 wherein said acoustic wave propagating substrate comprises one hundred twenty eight degree, Y-rotated, X-propagating lithium niobate.

14. The acoustic wave device as claimed in claim 11, wherein said first, second, third and fourth widths exceed 0.2 acoustic wavelength.

15. A surface acoustic wave resonator device comprising:

an acoustic wave propagating substrate;

a first acoustic reflector comprising first and second reflection elements disposed on said acoustic wave propagating substrate, said first and second reflection elements having first and second widths, respectively, and separated by one or more gaps breadths, wherein said first and second reflection elements having first and second acoustic reflection coefficients, respectively, said first and second acoustic reflection coefficients having similar values and vary in opposite fashions for similar variations in reflection element width;

a second acoustic reflector, said second acoustic reflector further comprising:

third and fourth reflection elements disposed on said acoustic wave propagating substrate, having third and fourth widths, respectively, and separated by one or more gap breadths; and at least a first acoustic transducer disposed between said fist and second acoustic reflectors.

16. An acoustic wave device having a reflector arrangement comprising:

an acoustic wave propagating substrate;

a plurality of reflection elements disposed on said acoustic wave propagating substrate, said plurality of reflection elements including first reflection elements each having a first width and a first reflection coefficient, said first reflection coefficient occurring to a first side of a local extremum of reflection coefficient versus electrode width, and second reflection elements each having a second width and a second reflection coefficient, said second reflection coefficient occurring to a second side of said local extremum, said second width being different from said first width, wherein said plurality of reflection elements comprise third reflection elements having a third width distinct from said first and second widths and fourth reflection elements having a fourth width distinct from said first, second and third widths; and a plurality of gaps having at least a first breadth disposed between said first and said second reflection elements, wherein said first and second widths have reflection coefficient magnitudes affected in equal and opposite ways by the same manufacturing variance in reflection element first and second widths.

17. An acoustic wave device having a reflector arrangement comprising:

an acoustic wave propagating substrate;

first reflection elements each having a first width and a first reflection coefficient A, said first reflection coefficient A occurring left of a local extremum on a curve depicting acoustic reflection coefficient magnitude on an ordinal axis versus reflection element width on an abscissal axis;

second reflection elements each having a second width and a second reflection coefficient B, said second reflection coefficient B occurring right of said local extremum on said curve; and wherein a first number of said first reflection elements and a second number of said second reflection elements provide a combined acoustic reflectivity equal to $aA+bB$, where a and b are integers representing said first and second numbers, respectively, independent of similar fabricated reflection element width variations for both said first and second reflection elements, providing modified first and second reflection coefficients $A''$ and $B''$, respectively, such that the combined acoustic reflectivity $aA''+bB''$ is equal to $aA+bB$.

* * * * *